(12) United States Patent
Wu et al.

(10) Patent No.: US 11,329,243 B2
(45) Date of Patent: May 10, 2022

(54) QUANTUM DOT LIGHT-EMITTING DIODE DEVICE AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Yuanchun Wu, Shenzhen (CN); Shibo Jiao, Shenzhen (CN); Shuren Zhang, Shenzhen (CN); Jing Chen, Shenzhen (CN); Lixi Wang, Shenzhen (CN); Jiangyong Pan, Shenzhen (CN); Yan Tu, Shenzhen (CN)

( * ) Notice: Subject to any disclaimer, the term of this patent is extended or adjusted under 35 U.S.C. 154(b) by 248 days.

(21) Appl. No.: 16/627,359

(22) PCT Filed: Nov. 12, 2019

(86) PCT No.: PCT/CN2019/117624
§ 371 (c)(1),
(2) Date: Dec. 30, 2019

(87) PCT Pub. No.: WO2020/258659
PCT Pub. Date: Dec. 30, 2020

(65) Prior Publication Data
US 2021/0359240 A1  Nov. 18, 2021

(30) Foreign Application Priority Data
Jun. 27, 2019 (CN) .................. 201910568200.X

(51) Int. Cl.
*H01L 51/50* (2006.01)
*H01L 51/56* (2006.01)
*H01L 51/00* (2006.01)

(52) U.S. Cl.
CPC ........ *H01L 51/5056* (2013.01); *H01L 51/502* (2013.01); *H01L 51/5004* (2013.01); *H01L 51/5072* (2013.01); *H01L 51/56* (2013.01); *H01L 51/0048* (2013.01); *H01L 2251/303* (2013.01)

(58) Field of Classification Search
CPC ............... H01L 51/5056; H01L 51/502; H01L 51/0048
See application file for complete search history.

(56) References Cited

U.S. PATENT DOCUMENTS

2011/0315952 A1* 12/2011 Yan .................. H01L 33/24
257/13

* cited by examiner

*Primary Examiner* — Anthony Ho

(57) ABSTRACT

The present invention provides a quantum dot light-emitting diode device, which includes a substrate, a first electrode disposed on the substrate, a hole layer vertically disposed on an anode, wherein the hole layer includes a sidewall, an electron transport layer disposed on the sidewall, a quantum dot layer disposed on the electron transport layer, and a second electrode disposed on the electron transport layer. A density of the zinc oxide nanowire is high in the present disclosure, causing high light current density, which greatly improves a brightness of light to achieve a purpose of increasing a light-emitting performance of the light-emitting diode device.

6 Claims, 2 Drawing Sheets

QUANTUM DOT LIGHT-EMITTING DIODE DEVICE AND MANUFACTURING METHOD THEREOF

FIELD OF INVENTION

The present disclosure relates to the field of light-emitting diode technology, and more particularly, to a quantum dot light-emitting diode device and a manufacturing method thereof.

BACKGROUND OF INVENTION

Quantum dot light-emitting diode (QD-LED) adopts quantum dot materials to form light-emitting layers, and the light-emitting layers are applied to a new display device of organic or electroluminescent polymer devices. Since a half width of emission spectrum of quantum dots is narrow, and a spectral range may be shifted as a size of quantum dots changes, QD-LED devices not only have high luminous efficiency, but also have luminous ranges covering all visible spectral ranges. Therefore, in recent years, researches on QD-LED devices have received extensive attention from domestic and foreign research groups.

SUMMARY OF INVENTION

At present, a performance of QD-LEDs, such as the external quantum efficiency is lower than organic light-emitting diodes, since a mobility of hole layers is lower than electron layers, an injecting rate of the holes is slower than the electrons causing unbalanced injections of the electrons and the holes. Currently, the performance of QD-LEDs is improved by optimizing properties of a material thereof, but a range selected of energy bands matched the hole layers is narrow.

One purpose of the present disclosure is to provide a quantum dot light-emitting diode device and a manufacturing method thereof that a carbon nanotube as a new hole layer to replace a traditional hole injecting layer and a traditional hole transport layer, which may effectively resolve the low mobility of the hole layers and the unbalanced injections of the electrons and the holes.

The present disclosure provides a quantum dot light-emitting diode device, which comprises a substrate, a first electrode disposed on the substrate, a hole layer vertically disposed on the first electrode, and the hole layer comprising a sidewall, an electron transport layer disposed on the sidewall, a quantum dot layer disposed on the electron transport layer, and a second electrode disposed on the electron transport layer.

Further, the hole layer is made of a carbon nanotube by ion vapor deposition.

Further, a length of the carbon nanotube ranges from 1 um to 5 um, and a diameter of the carbon nanotube ranges from 10 nm to 50 nm Further, the quantum dot layer is formed by spin coating, inkjet or electroplated a quantum dot solution, the quantum dot layer comprises at least one quantum dot, and the quantum dot comprises a core and a shell covering the core.

Further, a material of the core is one or more of cadmium sulfide, cadmium selenide, cadmium telluride, lead sulfide or lead selenide, and a material of the shell is zinc sulfide or zinc selenide.

Further, the electron transport layer comprises at least one zinc oxide nanowire, a length of the zinc oxide nanowire ranges from 1 um to 5 um, a diameter of the zinc oxide nanowire ranges from 10 nm to 80 nm, and a thickness of the second electrode ranges from 100 nm to 200 nm.

Another purpose of the present disclosure is to provide a manufacturing method of quantum dot light-emitting diode devices, which comprises steps of providing a substrate, disposing a first electrode on the substrate, depositing at least one carbon nanotube on the first electrode to form a hole layer, sputtering a zinc oxide seed on a sidewall of the hole layer, the zinc oxide seed heated and grown into a zinc oxide nanowire to form an electron transport layer, producing a quantum dot solution, coating the quantum dot solution on the zinc oxide nanowire, and sintering the quantum dot solution to form a quantum dot layer, and disposing a second electrode on the electron transport layer.

Further, the step of producing the quantum dot solution comprises steps of dissolving a first quantum dot solution in a non-polar solution to form the quantum dot solution, and a concentration of the quantum dot solution ranges from 10 mg/mL to 30 mg/mL.

Further, the non-polar solution is one of n-hexane, n-octane, cyclohexane, toluene or trioxane.

Further, in the step of producing the quantum dot solution, the concentration of the quantum dot solution ranges from 10 mg/mL to 20 mg/mL. In the step of coating the quantum dot solution on the zinc oxide nanowire, a number of coating times of the quantum dot solution ranges from 1 to 5 times. In the step of forming the quantum dot layer, a sintering temperature ranges from 100° C. to 200° C.

The present disclosure provides a new three-dimensional structure quantum dot light-emitting diode device, in which a vertical carbon nanotube replaces a traditional hole injecting layer and a traditional hole transport layer, a zinc oxide nanowire is grown on a sidewall of the carbon nanotube as an electron transport layer, and a quantum dot layer covers a surface of the zinc oxide nanowire. When holes and electrons respectively are injected from both terminals of the carbon nanotube and the zinc oxide nanowire, the electrons and the holes cannot be combined due to heterojunction interface. The electrons and holes are transferred to the conduction and valence bands of the quantum dot, and produce a photon after they are recombined. Each of the zinc oxide nanowire is considered as a light-emitting unit. A density of the zinc oxide nanowire is high in the present disclosure causing high light current density, which greatly improves a brightness of light to achieve a purpose of increasing a light-emitting performance of the light-emitting diode device.

DESCRIPTION OF DRAWINGS

In order to more clearly illustrate the technical solutions of the embodiments of the present invention, the drawings used in the description of the embodiments will be briefly described as below. Obviously, the drawings described as below are just some embodiments of the present invention. For one of ordinary skill in the art, under the premise of no creative labor, other drawings can also be obtained according to these drawings.

Figure 1:
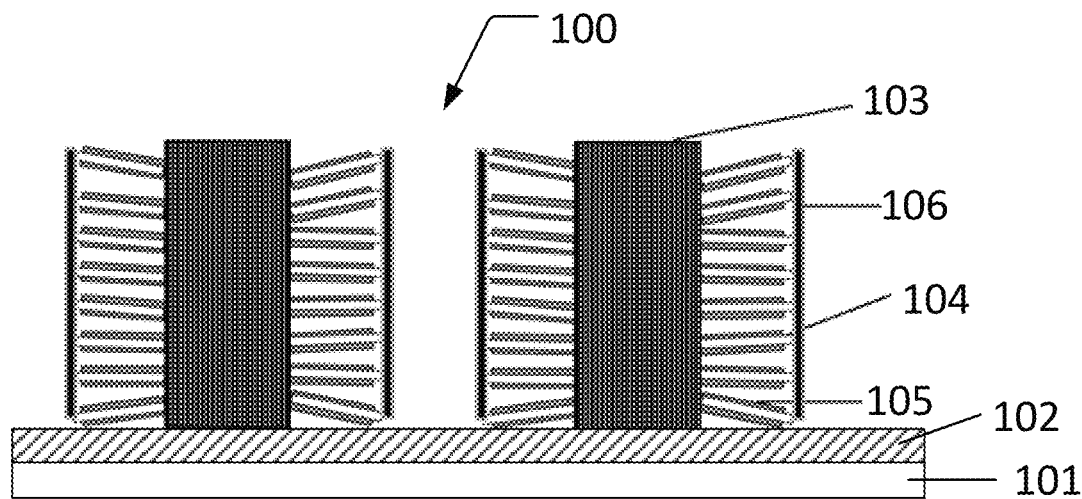
FIG. 1 is a schematic structural diagram of a quantum dot light-emitting diode device provided by the present disclosure.

Figure numerals: quantum dot light-emitting diode device 100; substrate 101; first electrode 102; hole layer 103; electron transport layer 104; quantum dot layer 105; second electrode 106.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as upper, lower, front, back, left, right, inner, outer, side, etc., are only directions by referring to the accompanying drawings. The names of the components mentioned in the present disclosure, such as the first, second, etc., are only to distinguish different components, and can be better expressed. In figures, elements with similar structures are indicated by the same numbers.

Embodiments of the present invention will be described in detail herein according to the drawings. The invention may be embodied in many different forms and the invention should not be construed as merely. The embodiments of the present disclosure are provided to explain the practical application of the present disclosure so that those skilled in the art can understand various embodiments of the present disclosure and various modifications suitable for the particular intended application.

As shown in FIG. 1, the present disclosure provides a quantum dot light-emitting diode device 100, which comprises a substrate 101, a first electrode 102, a hole layer 103, an electron transport layer 104, a quantum dot layer 105, and a second electrode 106.

The first electrode 101 is a flexible substrate, which is used for supporting the entire quantum dot light-emitting diode device. A material of the substrate 101 is polyimide, and the polyimide material has flexibility after drying.

The first electrode 102 is disposed on the substrate 101, and the first electrode 102 is a transparent indium tin oxide electrode, that is, an anode.

When the quantum dot light-emitting diode device is turned on, the first electrode 102 is used for removing electrons from current, that is, to increase holes.

The hole layer 103 is vertically disposed on the first electrode 102, and the hole layer 103 comprises a sidewall. The hole layer 103 is formed by a plurality of carbon nanotubes, and may be deposited by ion vapor deposition. The present disclosure sets carbon nanotubes as a new hole layer 103 to replace a traditional hole injecting layer and a traditional hole transport layer, to transport the holes to the quantum dot layer 105.

The carbon nanotubes have good stability, and the holes may be efficiently transported to the quantum dot layer 105, and the number of the holes and the electrons may be balanced.

Figure 3:
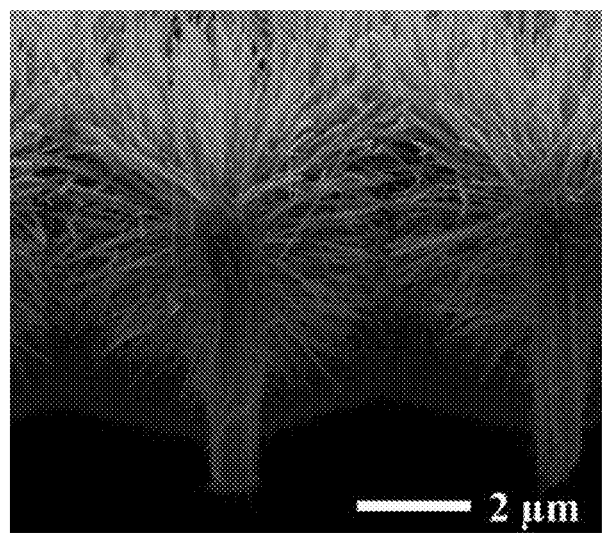
FIG. 3 is a schematic structural diagram of a hole carbon nanotube and a zinc oxide nanowire provided by the present disclosure.

A length of a single carbon nanotube ranges from 1 um to 5 um, preferably 3 um, and it may also be 2 um or 4 um. A diameter of the single carbon nanotube ranges from 10 nm to 50 nm, preferably 30 nm, and it may also be 20 nm or 40 nm. (referring to FIG. 3)

The electron transport layer 104 is disposed on a sidewall, and is used for transporting the holes from a cathode. The electron transport layer 104 comprises at least one zinc oxide nanowire, and a density is high to enhance the light-emitting (referring to FIG. 3). The zinc oxide nanowires are grown by using zinc oxide seeds under water-soluble conditions.

A length of a single zinc oxide nanowire ranges from 1 um to 5 um, preferably 3 um, and it may also be 2 um or 4 um. A diameter of the zinc oxide nanowire ranges from 10 nm to 80 nm, preferably 40 nm, and it may also be 20 nm, 30 nm, 50 nm, or 60 nm. (referring to FIG. 3)

The quantum dot layer 105 is disposed on the electron transport layer 104. The quantum dot layer 105 emits red or green light under action of an external electric field.

The quantum dot layer 105 is formed by spin coating, inkjet, or electroplating.

Specifically, if the quantum dot is formulated into a quantum dot solution, it is spin-coated on the electron transport layer 104 by a spin coating method, and sintered. A spin coating rate is 1000 rpm/min to 4000 rpm/min, preferably 2500 rpm/min, and it may also be 1500 rpm/min or 3000 rpm/min. A sintering time ranges from 30 seconds to 40 seconds, and a sintering temperature is 100 degrees to 200 degrees. An excessive concentration of the quantum dot solution may cause formation of a multilayer quantum dot film, and if it is too thin, a single layer coverage may be incomplete.

If a single layer film is formed by inkjet printing, the quantum dot solution is directly inkjet printed on the electron transport layer 104, and dried. A drying temperature ranges from 100 degrees to 200 degrees.

If it is formed by electroplating, a plating voltage ranges from 0 V to 100 V, and a drying temperature ranges from 100 degrees to 200 degrees.

The spin coating, inkjet, or electroplating quantum dot solution preparation method is repeated at least one to five times, that is, one to five layers of quantum dot film is formed.

A concentration of the quantum dot solution ranges from 10 mg/mL to 20 mg/mL, preferably 15 mg/mL, and it may also be 12 mg/mL or 18 mg/mL.

The quantum dot layer 105 comprises at least one quantum dot, and the quantum dot comprises a core and a shell covering the core.

A material of the core is one or more of cadmium sulfide, cadmium selenide, cadmium telluride, lead sulfide, and lead selenide, and a material of the shell is zinc sulfide or zinc selenide.

The second electrode 106 is disposed on the electron transport layer 104, and the second electrode 106 is a cathode. When an electric current flows through the quantum dot light-emitting diode, the cathode will inject the electrons into circuit.

Finally, an electric field is applied to the quantum dot light-emitting diode device 100 to emit red or green light.

The quantum dot light-emitting diode device of the present disclosure adopts vertical carbon nanotubes to replace a traditional hole injecting layer and a traditional hole transport layer, and a zinc oxide nanowire is grown on a sidewall of the carbon nanotube as an electron transport layer 104, and a quantum dot layer covers a surface of the zinc oxide nanowire. When holes and electrons respectively are injected from both terminals of the carbon nanotube and the zinc oxide nanowire, a photon is produced at the quantum dot layer 105. Each of the zinc oxide nanowire is considered as a light-emitting unit.

The present disclosure further provides a manufacturing method of a quantum dot light-emitting diode device, which comprises steps S1 to S7 as below.

Step S1 is providing a substrate 101. The substrate 101 is a flexible substrate, which is used for supporting the entire quantum dot light-emitting diode device. A material of the substrate 101 is polyimide, and the polyimide material has flexibility after drying.

Step S2 is disposing a first electrode 102 on the substrate 101. The first electrode 102 is a transparent indium tin oxide electrode, that is, an anode.

When the quantum dot light-emitting diode device is turned on, the first electrode 102 is used for removing electrons from current, that is, to increase holes.

Step S3 is depositing at least one carbon nanotube on the first electrode 102 to form a hole layer 103, sintered in a nitrogen atmosphere for 20 minutes, at a sintering temperature of 150 degrees. The hole layer 103 comprises a sidewall.

A length of a single carbon nanotube ranges from 1 um to 5 um, preferably 3 um, and it may also be 2 um or 4 um. A diameter of the single carbon nanotube ranges from 10 nm to 50 nm, preferably 30 nm, and it may also be 20 nm or 40 nm.

Step S4 is sputtering a zinc oxide seed on a sidewall of the hole layer 103, the zinc oxide seed heated and grown into a zinc oxide nanowire to form an electron transport layer 104. A heating temperature is 95° C.

A length of a single zinc oxide nanowire ranges from 1 um to 5 um, preferably 3 um, and it may also be 2 um or 4 um. A diameter of the zinc oxide nanowire ranges from 10 nm to 80 nm, preferably 40 nm, and it may also be 20 nm, 30 nm, 50 nm, or 60 nm.

Step S5 is producing a quantum dot solution. A concentration of the quantum dot solution ranges from 10 mg/mL to 20 mg/mL, preferably 15 mg/mL, and it may also be 12 mg/mL or 18 mg/mL.

The step of producing the quantum dot solution comprises a step of dissolving a first quantum dot solution in a non-polar solution to form the quantum dot solution, and the non-polar solution is one of n-hexane, n-octane, cyclohexane, toluene or trioxane.

A concentration of the quantum dot solution ranges from 10 mg/mL to 30 mg/mL.

Step S6 is coating the quantum dot solution on the zinc oxide nanowire, and sintering the quantum dot solution to form a quantum dot layer 105.

In the step of coating the quantum dot solution on the zinc oxide nanowire, a number of coating times of the quantum dot solution ranges from 1 to 5 times.

Specifically, if the quantum dot is formulated into a quantum dot solution, it is spin-coated on the electron transport layer 104 by a spin coating method, and sintered. A spin coating rate ranges from 1000 rpm/min to 4000 rpm/min, a sintering time ranges from 30 seconds to 40 seconds, and a sintering temperature ranges from 100 degrees to 200 degrees. An excessive concentration of the quantum dot solution may cause formation of a multilayer quantum dot film, and if it is too thin, a single layer coverage may be incomplete.

If a single layer film is formed by inkjet printing, the quantum dot solution is directly inkjet printed on the electron transport layer 104, and dried. A drying temperature ranges from 100 degrees to 200 degrees.

If it is formed by electroplating, a plating voltage ranges from 0 to 100 V, and a drying temperature ranges from 100 degrees to 200 degrees.

The spin coating, inkjet, or electroplating quantum dot solution preparation method is repeated at least one to five times, that is, one to five layers of quantum dot film is formed.

The quantum dot solution comprises a green light quantum dot solution or a red light quantum dot solution, which can be manufactured as needed.

Step S7 is disposing a second electrode 106 on the electron transport layer 104. The second electrode 106 is disposed on the electron transport layer 104, and the second electrode 106 is a cathode. When an electric current flows through the quantum dot light-emitting diode, the cathode will inject the electrons into circuit.

Finally, the voltage applied to the quantum dot light-emitting diode is 2.5 V, which can be illuminated. A color is red or green. A luminance of the light-emitting diode is greater than 5000 cd/m$^2$, and a quantum dot light-emitting diode device 100 has an efficiency greater than 5 cd/A.

The present disclosure provides a new three-dimensional structure, which adopts a vertical carbon nanotube to replace a traditional hole injecting layer and a traditional hole transport layer, a zinc oxide nanowire is grown on a sidewall of the carbon nanotube as an electron transport layer 104, and a quantum dot layer 105 covers a surface of the zinc oxide nanowire.

Figure 2:
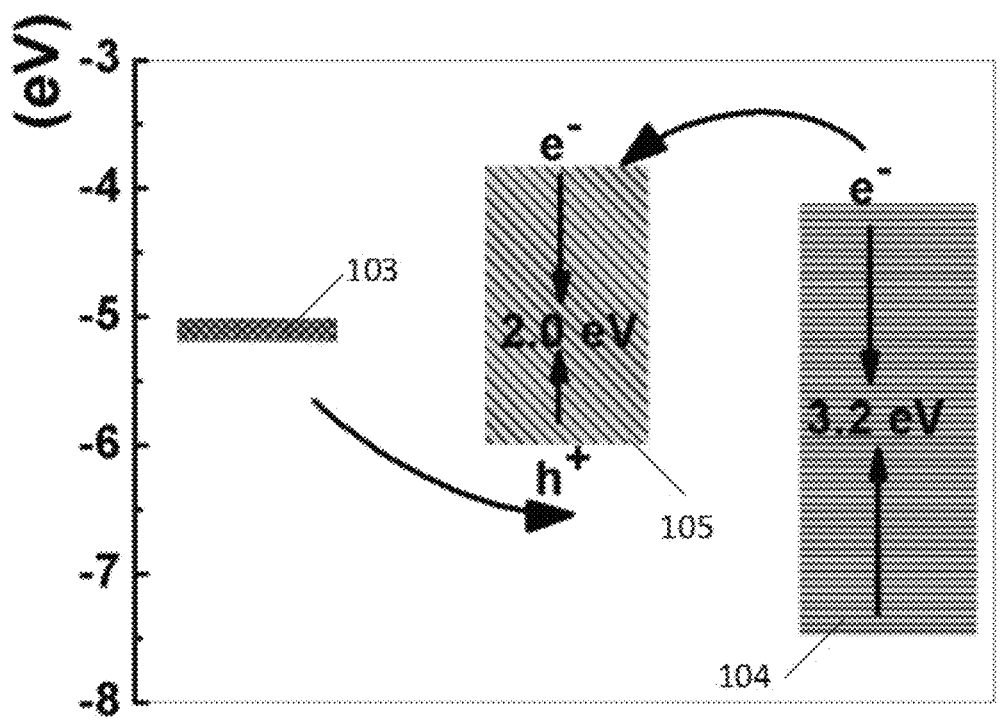
FIG. 2 is a schematic structural diagram of an energy band of a quantum dot light-emitting diode device provided by the present disclosure.

As shown in FIG. 2, when holes of the hole layer 103 and electrons of the electron transport layer 104 respectively are injected from both terminals of the carbon nanotube and the zinc oxide nanowire, the electrons and the holes cannot be combined due to heterojunction interface. The electrons and the holes are transferred to conduction bands and valence bands of the quantum dots, and a photon is produced after the electrons and the holes are recombined. Each of the zinc oxide nanowire of the quantum dot layer 105 is considered as a light-emitting unit. A density of the zinc oxide nanowire is high in the present disclosure (referring to FIG. 3) causing high light current density, which greatly improves a brightness of light to achieve a purpose of increasing a light-emitting performance of the light-emitting diode device.

The technical scope of the present disclosure is not limited only to the contents of the description. A person skilled in the art can make various modifications to the embodiment without departing from the technical idea of the present disclosure, and the various modifications should be within the scope of the disclosure.

What is claimed is:

1. A quantum dot light-emitting diode device, comprising:
   a substrate;
   a first electrode disposed on the substrate;
   a hole layer vertically disposed on the first electrode, and the hole layer comprising a sidewall;
   an electron transport layer disposed on the sidewall;
   a quantum dot layer disposed on the electron transport layer; and
   a second electrode disposed on the electron transport layer.

2. The quantum dot light-emitting diode device as claimed in claim 1, wherein the hole layer consists of a carbon nanotube prepared by ion vapor deposition.

3. The quantum dot light-emitting diode device as claimed in claim 2, wherein a length of the carbon nanotube ranges from 1 um to 5 um; and a diameter of the carbon nanotube ranges from 10 nm to 50 nm.

4. The quantum dot light-emitting diode device as claimed in claim 1, wherein the quantum dot layer is formed by spin coating, inkjet printing, or electroplating a quantum dot solution, the quantum dot layer comprises at least one quantum dot, and the at least one quantum dot comprises a core and a shell covering the core.

5. The quantum dot light-emitting diode device as claimed in claim 4, wherein a material of the core is one or more of cadmium sulfide, cadmium selenide, cadmium telluride, lead sulfide, and lead selenide; and a material of the shell is zinc sulfide or zinc selenide.

6. The quantum dot light-emitting diode device as claimed in claim 1, wherein the electron transport layer comprises at least one zinc oxide nanowire, a length of the zinc oxide nanowire ranges from 1 um to 5 um, a diameter of the zinc oxide nanowire ranges from 10 nm to 80 nm, and a thickness of the second electrode ranges from 100 nm to 200 nm.

* * * * *